(12) United States Patent
Lee et al.

(10) Patent No.: US 6,181,607 B1
(45) Date of Patent: Jan. 30, 2001

(54) REVERSED SPLIT-GATE CELL ARRAY

(75) Inventors: Peter W. Lee; Fu-Chang Hsu, both of Saratoga; Hsing-Ya Tsao, Santa Clara, all of CA (US)

(73) Assignee: Aplus Flash Technology, Inc., Santa Clara, CA (US)

( * ) Notice: Under 35 U.S.C. 154(b), the term of this patent shall be extended for 0 days.

(21) Appl. No.: 09/351,740

(22) Filed: Jul. 12, 1999

Related U.S. Application Data

(63) Continuation-in-part of application No. 09/298,032, filed on Apr. 22, 1999, now Pat. No. 6,031,765.

(51) Int. Cl.[7] .................................................. G11C 16/04
(52) U.S. Cl. .............................. 365/185.29; 365/185.05; 365/185.11
(58) Field of Search ...................... 365/185.29, 185.05, 365/185.11, 185.33

(56) References Cited

U.S. PATENT DOCUMENTS

| | | | |
|---|---|---|---|
| 4,794,565 | * 12/1988 | Wu et al. | 365/185.15 |
| 4,999,812 | 3/1991 | Amin | 365/185 |
| 5,777,924 | 7/1998 | Lee et al. | 365/185.11 |

* cited by examiner

*Primary Examiner*—Vu A. Le
(74) *Attorney, Agent, or Firm*—George O. Saile; Stephen B. Ackerman

(57) ABSTRACT

In the present invention an array for a reverse split gate device is described for creating a flash memory that avoids both programming and erase disturb conditions. The device is designed so that the stacked gate is associated with the source and the enhancement gate is associated with the drain. This is the reverse of a conventional spit gate design and allows the drain to buffer the stacked gate from bit lines of a flash memory array. The source line now key to both program and erase operations is laid out in rows where two adjacent rows of cells share the same source line. The source line can be segmented to prevent the entire length of the pair of rows from being erased. The cell is programmed by flowing current backwards in the channel and injecting electrons into the floating gate from an impact ionization that occurs near the source. Erasure is accomplished by Fowler-Nordheim tunneling from the floating gate to the source caused by a potential between the source and the enhancement gate.

24 Claims, 7 Drawing Sheets

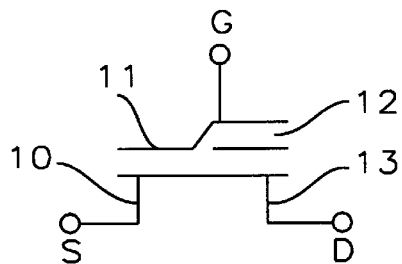
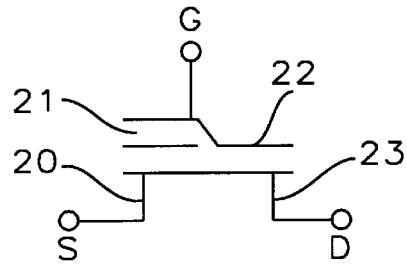
FIG. 1a – Prior Art
FIG. 2a
| Voltage examples | |
|---|---|
| Program | Deselected |
| $V_g = +8V$ | $V_g = 0V$ |
| $V_d = +5V$ | $V_d = 0V$ |
| $V_s = 0V$ | $V_s = 0V$ |
| Erase | Deselected |
| $V_g = -8V$ | $V_g = 0V$ |
| $V_d = +5V$ | $V_d = 0V$ |
| $V_s = 0V$ | $V_s = 0V$ |
| Voltage examples | |
|---|---|
| Program | Deselected |
| $V_g = +8V$ | $V_g = 0V$ |
| $V_d = 0V$ | $V_d = +5V$ |
| $V_s = +5V$ | $V_s = +5V$ |
| Erase | Deselected |
| $V_g = -8V$ | $V_g = 0V$ |
| $V_d = 0V$ | $V_d = 0V$ |
| $V_s = +5V$ | $V_s = 0V$ |
FIG. 1b – Prior Art
FIG. 2b

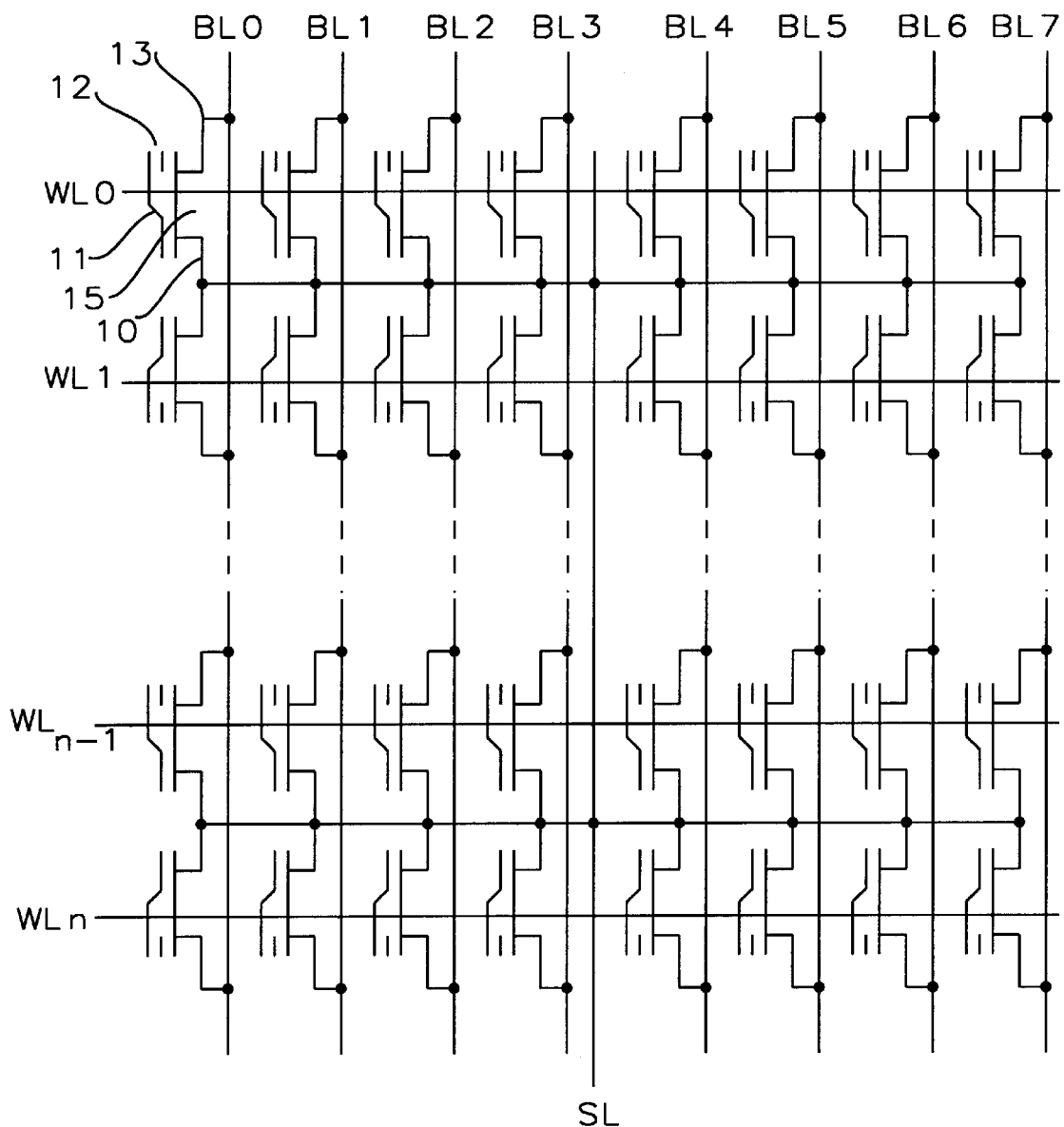
FIG. 3a – Prior Art
| VOLTAGE EXAMPLES | | | | | |
|---|---|---|---|---|---|
| | WL0 | BL0 | SL | BL1–BL7 | WL1–WLn |
| PROGRAM | 8V | 5V | 0V | 0V | 0V |
| ERASE | −8V | 5V | float | 0V | 0V |
FIG. 3b – Prior Art

| VOLTAGE EXAMPLES | | | | | | |
|---|---|---|---|---|---|---|
| | WL0 | WL1 | BL0 | SL0 | SL1-SIn | BL1-BIn | WL2-WIn |
| PROGRAM | 8V | 0V | 0V | 5V | 0V | 5V | 0V |
| ERASE | −8V | −8V | 0V | 5V | 0V | 0V | 0V |

| VOLTAGE EXAMPLES | | | | | | | | | | |
|---|---|---|---|---|---|---|---|---|---|---|
| | WL0 | WL1 | WLn-1 —WIn | BI0 | BL1-BIm | BLm+1 -BL2m | SL0 | SLn | SS1 | SS2 |
| PROGRAM | 8V | 0V | 0V | 0V | 5V | 5V | 5V | 0V | 8V | 0V |
| ERASE | -8V | -8V | 0V | 0V | 0V | 0V | 5V | 0V | 8V | 0V |

FIG. 5b

REVERSED SPLIT-GATE CELL ARRAY

This is a Continuation in Part of U.S. patent application Ser. No. 09/298,032, filed on Apr. 22, 1999, now U.S. Pat. No. 6,031,765, and assigned to a common assignee.

BACKGROUND OF THE INVENTION

1. Field of Invention

The present invention relates to semiconductor memories and in particular to arrays of flash memory cells designed to prevent program and erase disturb.

2. Description of Related Art

One of the problems associated with a flash memory is bit line and word line disturbs which are caused by bit line and word line voltages being coupled to the deselected cells as well as the selected cells on the same bit line or word line during erase, program and read operations. The effect of the bit line and word line disturb is to change the threshold voltage of the disturbed cells. This is an accumulative effect that over time will cause a memory error, will shorten the program and erase cycles, and reduce product life.

In U.S. Pat. No. 5,777,924 (Lee et al.) a flash memory circuit erases adjacent row simultaneously and eliminates over erasure and source disturbance problems associated with conventional flash memories. In U.S. Pat. No. 4,999,812 (Amin) an EEPROM device provides increased speed with lower susceptibility to soft writes during reading and programming operations. A unique circuit design and operating method obviates the need for applying a high programming voltage or erase voltage to the path between the sense amplifiers and the memory array.

A split-gate cell is well known in industry today and has a structure equivalent to two transistors in series. One of the two transistors is an enhancement gate transistors and the other is a stacked gate transistor. These two transistors are geometrically joined with the gate of the enhancement transistor being the control gate of the stacked gate transistor. The stacked gate transistor performs like a conventional simple stacked gate cell, where its floating gate is formed by a first layer polysilicon under a control gate made from a second layer polysilicon. The number of electrons stored on the floating gate changes the threshold of the stacked gate transistor which determines the value of the stored data on the floating gate. The enhancement gate of the split gate cell performs as a selector for the stacked gate transistor, and has a positive threshold voltage (approximately 0.7 Volt). This allows the enhancement gate to act as a good selector for accessed cells and a good isolator for deselected cells without consideration of the threshold voltage of the stacked gate transistor.

Bit line and wordline disturb conditions occur in memory arrays that use split gate cells. This can occur during programming and reading when a combination of voltages must be applied to a particular split gate cell but also extend to other cells that are deselected. A disturb condition also occurs during erasure of a column of cells where word lines for the cells in the column are at a high negative potential and extend to other cells in other columns that are deselected and inhibited for erasure. Although a particular operation (read, program or erase) are not carried out in the other cells that are inhibited, the bias on a bit line or a word line extends to the other cells that are inhibited and can reduce the charge on the floating gates of those cells, albeit at a slow rate. The charge on the floating gate of a split gate cell determines the threshold voltage which determines the logical value of tie stored data on the stacked gate portion of the split gate cell. The charge can be reduced over time from repeated disturb operations until the threshold voltage of the stacked gate portion of the cell drops below a point where the stored value is in error.

SUMMARY OF THE INVENTION

In the present invention a reverse split gate cell is described along with its interconnection in a flash memory array that eliminates bit line and word line disturb conditions. In the conventional split gate cell the enhancement gate is associated with the source and the stacked gate is associated with the drain. In the reverse split gate cell the enhancement gate is associated with the drain and the stacked gate is associated with the source of the cell. As with the conventional cell, the drain of the reverse spit gate is connected to the bit lines of a flash memory array, but because the enhancement gate is associated with drain, the stacked gate is isolated from the bit lines when the drain is biased off.

In order to erase a reverse split gate cell a potential must be applied from the source to the enhancement gate. This will cause the cell to be erased by Fowler-Nordheim tunneling. In the designs used with the reverse split gate, source lines run in the direction of word lines. Since the stacked gate is associated with the source and the source is tied to a source line, a row of cells (or two rows of cells since it is common to double up on source lines to save layout space) will be erased at one time. A positive voltage is applied to the source line and a negative voltage is applied to the word lines connected to the enhancement gates of the cells to be erased. The bit lines connected to drains of the cells being erased are biased at zero volts or preferably left floating. This keeps the drain of the erased cells turned off, as well as drains in other rows not being erased, and isolates the bit lines from a possible disturb condition. The source line can be segmented to create more than one section along a source line which can be independently erased. This requires selectors in series with the source line to connect the source line erase voltage to only a portion of the source line. The word lines associated with the segmented rows of cells being erased extend to other cells in segments of the rows which are not being erased. These cells are not affected by the word line voltage since both their drain and source voltages are held at zero volts. One or more source lines can be activated by the application of a positive voltage connected to each source line by a segment control switch. This coupled with the ability to connect a negative voltage to one or more word lines allows the erasure of flash memory cells ranging from those connected to one segmented source line to the entire array.

To program a cell, a source line connected to the source of the cell to be programmed must have an applied voltage. The bit line connected to the drain of the cell to be programmed is connected to circuit ground, and the word line associated with the cell to be programmed is connected to a positive voltage greater in magnitude that the voltage connected to the source line. This causes a heavy current to flow in a backward direction in the channel from source to drain and induces a mechanism called "impact ionization" which creates an abundance of electron-hole pairs near the source of the cell. A large number of electrons are injected into the floating gate promoted by the electric field across the enhancement gate to source. Other word lines not being used for programming a cell are biased off as are other source lines not involved in programming the cell, preventing a disturb condition to occur. Bit lines connected to other cells in a row not being programmed are biased at the same voltage as the source line of the programmed cell. This prevents programming current from flowing in the cells not being programmed but connected to the word line of the cell being programmed. The positive voltage connected to the other bit lines also does not cause a problem in cell rows not biased by a word line or a source line because the enhancement gate is biased off, blocking the voltage on the bit lines. Thus programming a reverse spilt gate memory cell does not produce a disturb condition for other cells not being programmed.

The source line can run in parallel with the word lines for a portion of the source line length. Over this portion of the source line a metal layer can be connected to the source line in a plurality of contacts which is sometimes called metal-strapping. This metal strapping reduces the resistance of the source line and improves performance. A plurality of these metal-strapped source lines can be coupled together to achieve erasure of a plurality of rows of cells at the same time.

BRIEF DESCRIPTION OF THE DRAWINGS

This invention will be described with reference to the accompanying drawings, wherein:

FIG. 1a is symbolic diagram of a split gate flash memory cell of prior art

FIG. 1b is a table of voltages needed to program and erase the split gate flash memory cell of prior art, FIG. 2a is a symbolic diagram of the reverse split gate flash memory cell of this invention, FIG. 2b is a table of voltages needed to program and erase the reverse split gate flash memory cell, FIG. 3a is a diagram of a flash memory using the split gate memory cell of prior art, FIG. 3b is a table showing the voltages necessary to program and erase the flash memory using the prior art split gate memory cell, FIG. 5b is a showing the voltages necessary to program and erase the flash memory with a segmented source line using the reverse split gate memory cell.

DETAILED DESCRIPTION OF THE PREFERRED EMBODIMENT

Figures 4A, 4B:
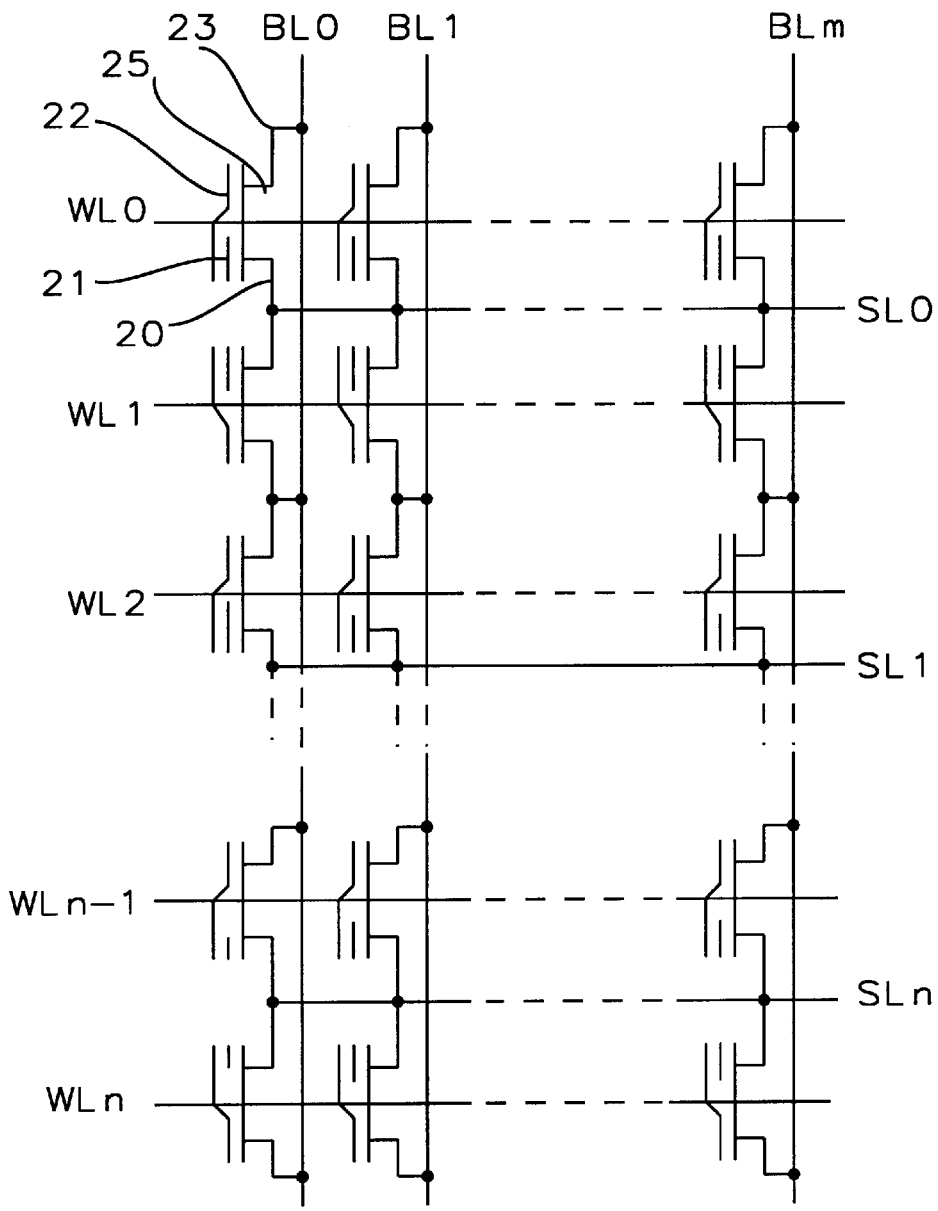
FIG. 4a is a diagram of a flash memory using the reverse split gate memory cell of this invention.
FIG. 4b is a table showing the voltages necessary to program and erase the flash memory using the reverse split gate memory cell.

In FIG. 1a is shown a symbolic diagram of a conventional split gate flash memory cell. A source 10 is shown below and in the proximity of the enhancement gate 11. The enhancement gate 11 is connected to and is the top layer of the stacked gate 12. The drain 13 lies below and in the proximity of the stacked gate 12. In FIG. 1b is shown examples of voltages necessary to program and erase and to deselect the conventional split gate cell for both program and erase, and to provide a deselected state for both conditions. To program the split gate cell of FIG. 1a, a positive voltage of approximately +8 V is applied to the enhancement gate 11, a positive voltage of approximately +5 V is applied to the drain 13 and the source 10 is connected to circuit ground. This will produce a heavy current flowing in the channel from the drain and to the source creating an impact ionization near the drain from which electrons are injected into the floating gate of the stacked gate 12. To deselect the split gate cell from programming the enhancement gate, drain and source are all connected to zero volts to avoid potential disturb conditions. When this deselected bias state cannot be maintained as a result of a bias on one of the lines, a potential disturb condition exists.

Continuing to refer to FIG. 1b, a cell is erased by applying approximately −8 V to the enhancement gate 11, +5 V to the drain 13 and zero volts to the source. The voltage gradient from the drain to the enhancement gate extracts electrons from the floating gate of the stacked gate 12 using Fowler-Nordheim tunneling. A cell can be deselected during erasure by connecting zero volts to the drain, source and enhancement gate. However, the word line connected to the enhancement gate 11 and the bit line connected to the drain 13 will provide a bias to cells not being erased but connected to the word line and bit line. This bit line and word line bias provides opportunity for the information stored on the floating gate of other cells to be disturbed over time from electrons being injected or extracted from their floating gates.

In FIG. 2a is shown a symbolic diagram of the reverse split gate flash memory cell of the present invention. A source 20 is shown below and in the proximity of the stacked gate 21. An enhancement gate 22 is connected to and is the top layer of the stacked gate 21. The drain 23 lies below and in the proximity of the enhancement gate 22. Comparing FIG. 1a and FIG. 1b, it is readily seen the gate structure of the reverse split gate of the present invention is opposite of the conventional spit gate. The enhancement gate 22 of the present invention is on the drain side of the cell whereas the enhancement gate 11 is on the source side in the conventional split gate. The stacked gate 21 of the present invention is on the source side of the cell whereas the stacked gate 12 is on the source side in the conventional split gate. The drain of the reverse split gate cell connects to bit lines of a memory array. Since the drain is associated with the enhancement gate the bit lines can be isolated from the reverse split gate cell by biasing off the drain.

In FIG. 2b is shown approximate examples of voltages necessary to program and erase and to deselect the reverse split gate cell for both program and erase operations. To program the split gate cell of FIG. 2a, a positive voltage of approximately +8 V is applied to the enhancement gate 22, a positive voltage of approximately +5 V is applied to the source 20 and the drain 23 is connected to circuit ground. This will produce a heavy current flowing backward in the channel from tic source and to the drain creating an impact ionization near the source from which electrons are injected into the floating gate of the stacked gate 21. To deselect the split gate cell from programming the enhancement gate 22 is connected to zero volts in rows not having a cell being programmed, and a voltage of approximately +5 V is connected to the drain 23 to match the voltage connected to the source 20 to prevent current from flowing in the channel of cells on the sale word line but not being programmed. In other cells on word lines not involved in programming 0 V is maintained on the gate, drain and source of the cells.

Continuing to refer to FIG. 2b, a cell is erased by applying approximately −8 V to the enhancement gate 22, +5 V to the source 20 and zero volts to the drain. The voltage gradient from the source to the enhancement gate extracts electrons from the floating gate of the stacked gate 21 using Fowler-Nordheim tunneling. The drain is turned off, isolating the bit line from the erasure voltages. Since the reverse split gate is erased in rows, a cell not connected to that row can be deselected during an erase operation by connecting zero volts to the drain, source and enhancement gate.

In FIG. 3a is shown a portion of a flash memory array of prior art using the conventional split gate cell. This diagram is being shown to demonstrate the disturb problems associated with conventional split gate flash memories and how the reverse split gate cell eliminates those problems. FIG. 3b shows the approximate voltages necessary to program and erase the split gate cell at the intersection of the word line WL0 and the bit line BL0.

Continuing to refer to FIGS. 3a and 3b, a positive voltage of approximately 8 V is connected to word line WL0 to program cell 15. Word line WL0 connects to the enhancement gate 11 of split gate cell 15 and to all other enhancement gates of cells located in the row containing cell 15. A positive voltage of approximately 5 V is connected to bit line BL0 which is connected to the drain 13 of cell 15 and to all the other drains in the column of cells that contains cell 15. A source line SL connects a voltage of 0 V to all the sources 10 of cells in the flash memory array. Word lines WL1 to WLn and bit lines BL1 to BL7 are connected to 0 V preventing cells connected to these word lines and bit lines from being biased on and attempting to prevent potential disturb conditions. However, all the cells connected to bit line BL0 will see the approximate 5 V bit line bias, and all the cells connected to WL0 will see the approximate 8 V for the duration of the program operation. These voltages over time can degrade the charge stored on the floating gates causing a disturb condition.

Continuing to refer to FIGS. 3a and 3b, to erase a conventional split gate cell a positive voltage of approximately 5 V is applied to the drain, and a negative voltage of approximately −8 V is applied to the enhancement gate. Since a bit line commons all drains of cells in the column, erasure is done on a column basis rather than cell by cell to save time. This means all word lines WL0 to WLn, that intersect the column of BL0 are connected to approximately −8 V which in turn is connected to the enhancement gates of the cell in other columns. Bit line BL0 is connected to approximately 5 V and bit lines BL1 to BL7 are connected to 0 V with the source line SL connected to 0 V or left floating. Every word line connected to cells in the column of BL0 is biased to a negative voltage and provides opportunity to produce word line disturb in other cells in the other columns that are not being erased.

Shown in FIG. 4a is a portion of a flash memory constructed from the reverse split gate cell 25 of the present invention. There are bit lines BL0 to BLn each connecting to drains 23 in columns of cells. Word lines WL0 to WLn connect to enhancement gates 22 of cells located in rows. Since the stacked gate 21 is related to the source 20, the source 20 and source lines SL0 to SLn become a major factor in programming and erasing the reverse split gate cells. To minimize layout problems and save space two rows of cells, such as WL0 and WL1, are connected to a common source line SL0. All other rows are similarly paired, such as WLn-1 and WLn, and through this paired interconnection form regions in the flash memory that are erased together. The bit lines BL0 to BLm are connected to the drains 23 of columns of reverse split gate cells. Since the drains are associated with the enhancement gate (as opposed to the stacked gate located on the source side) the bit lines and the cells can be isolated from each other by biasing the drain off.

Continuing to refer to FIG. 4a and referring to FIG. 4b, a reverse split gate cell 25 is programmed by connecting a positive voltage of approximately 8 V to word line WL0 and connecting a positive voltage of approximately 5 V to source line SL0. The bit line BL0 is connected to circuit ground allowing a heavy current to flow backward from the source 20 to the drain 23 and forming an impact ionization near the source from which electrons are injected into the floating gate contained in the stacked gate 21. The electrons added to the floating gate raise the threshold of the stacked gate transistor portion of the reverse split gate cell. The threshold is a a measurable item and can be used to determine the value of data stored on the floating gate Bit lines BL1 to BLm are connected to a positive voltage of approximately 5 V which blocks any channel current attempting to flow from the selected source line SL0. Other source lines SL1 to SLn and Word lines WL1 to WLn are connected to ground eliminating any possible disturb conditions from the programming of cell 25. The +5 V of bit lines BL1 to BLm extending to other cells not connected to the first two rows do not present a disturb condition since the drains of the other cells are held off by their enhancement gates being biased at 0 V.

Continuing to refer to FIGS. 4a and 4b, as mentioned previously for the reverse split gate cell of the present invention, erasing is done in pairs of rows of cell connected to a common source line. Although, erasure could be done to a single row by taking the risk of disturbing the adjacent row connected to the same source line, or by using a separate source line for each row of memory cells. Word lines WL0 and WL1 are connected to a negative voltage ranging from approximately zero volts to approximately −8 V and source line SL0 is connected to a positive voltage of approximately 5 V. This sets up a field across the source 20 to the enhancement gate 22 that extracts electrons from the floating gate of the stacked gate 21 by means of Fowler-Nordheim tunneling. As electrons are extracted the threshold of the stacked gate portion of the reverse split gate is reduced and at some predetermined threshold voltage the stacked gate will be defined as erased. All bit lines BL0 to BLm are held at 0 V as are the other word lines WL2 to WLn and source lines SL1 to SLn. This isolates the other cells from the erase voltages applied to the word lines WL0 to WL1 and source line SL0. If a positive voltage of approximately 5 V is applied to additional source lines SL1 to SLn and a negative voltage is applied to additional appropriate pairs of word lines WL2 to WLn, then erasure can be applied to additional reverse split gate cells in pairs of word lines up to and including the entire array of reverse split gate cells. The negative voltage can range from approximately zero volts to approximately −8 V.

Figure 5A:
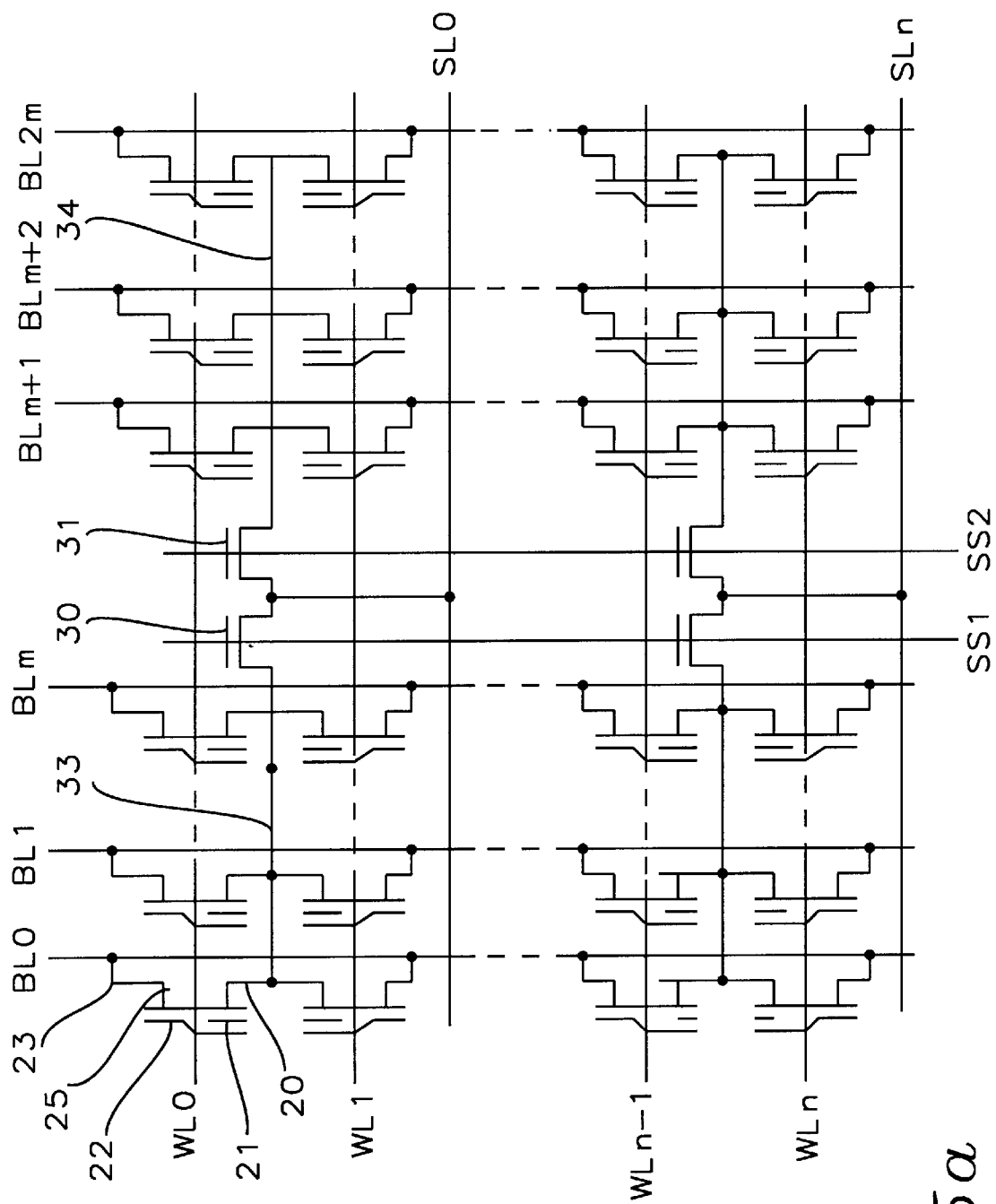
FIG. 5a is a diagram of a flash memory with segmented source lines using the reverse split gate memory cell of this invention.

Referring to FIGS. 5a and 5b, the flash memory array of FIG. 5a is the same as that of FIG. 4a with the exception that the source lines SL0 to SLn are segmented into at least two sections by segment switches 30 and 31. Segment control lines SS1 and SS2 control the segment switches 30 and 31 to connect the source line voltage SL0 to SLn to one segment while leaving the other segments not being erased or involved in programming a cell to float.

Continuing to refer to FIGS. 5a and 5b, as an example, two rows of cells 25 connected to word lines WL0 and WL1 by their enhancement gates 22 are erased simultaneously up to the segment switch 30 which is activated by SS1 to connect source voltage of approximately 5 V on source line SL0 to the source line segment 33. This includes cells in columns connected to bit lines BL0 to BLm which connect 0 V to the drains of the cells in the segmented rows that are being erased. The wordlines WL0 and WL1 extend into adjacent segments of cells connected to bit lines BLm+1 to BL2m. The bit lines, BLm+1 to BL2m, in tie adjacent segments provide a 0 V bias that turns off the drains, and the sources in the adjacent segment 34 are left floating by the segment switch 31. The combination of floating sources and zero biased drains isolates these cells from disturb conditions caused by the biased wordlines WL0 and WL1. If segment switch 30 is activated by applying approximately 8 V to SS1 and segment switch 31 is activated by applying approximately 8 V to SS2, the voltage on source line SL0 will be connected to source line segments 33 and 34, and all the cells connected to word lines WL0 and WL1 will be erased together. Similarly multiple pairs of rows of reverse split gate cells can be erased up to and including the entire array as a function of the application of approximately 5 V to source line segments connected to SL0 to SLn and approximately −8 V to the word line pairs WL0 and WL1 to WLn−1 and WLn that are associated with activated source line segments. One half of the array of reverse split gate cells can be erased by selecting source line segment 33 or 34 using source selector SS1 or SS2. The entire array can be erased when both source line segments 33 and 34 are selected using source selectors SS1 and SS2 and all word lines are connected to approximately −8 V.

Continuing to refer to FIGS. 5a and 5b, programming cell 25 requires the drain to be connected to circuit ground through bit line BL0, a positive voltage of approximately 8 V connected to the enhancement gate 22 through word line WL0, and a positive voltage of approximately 5 V connected to the segmented source line 33 from source line SL0 by segment switch 30 controlled by segment control line SS1. This allows a heavy current to flow backwards through the channel of cell 25 from source 20 to drain 23. An impact ionization occurs near the source that injects electrons onto the floating gate of the stacked gate 21. As electrons build up on the floating gate the threshold of the stacked gate portion 21 of the split gate cell 25 raises and at a predetermined threshold level the data stored on the floating gate changes from one logical state to another. When the threshold changes from one defined state to another the cell is considered to be programmed to the second state.

Continuing to refer to FIGS. 5a and 5b, disturb conditions are isolated to the areas where operations are being performed. The source line used to program and erase cells is isolated to connection one segmented set of adjacent rows. Bit lines connected to drains 23 that are not being programmed are connected to a bit line voltage of approximately 5 V which is similar to the voltage connected to the sources 20 from the segmented source line 33. This prevents current from flowing in deselected cells connected to a word line WL0 involved in programming a cell. During erasure of a segment of cells, adjacent segments are protected from being disturbed by bit lines connecting 0 V to drains and by sources lines 34 that are left to float by the segment switch 31 under the control of the segment select line SS2.

Figure 6:
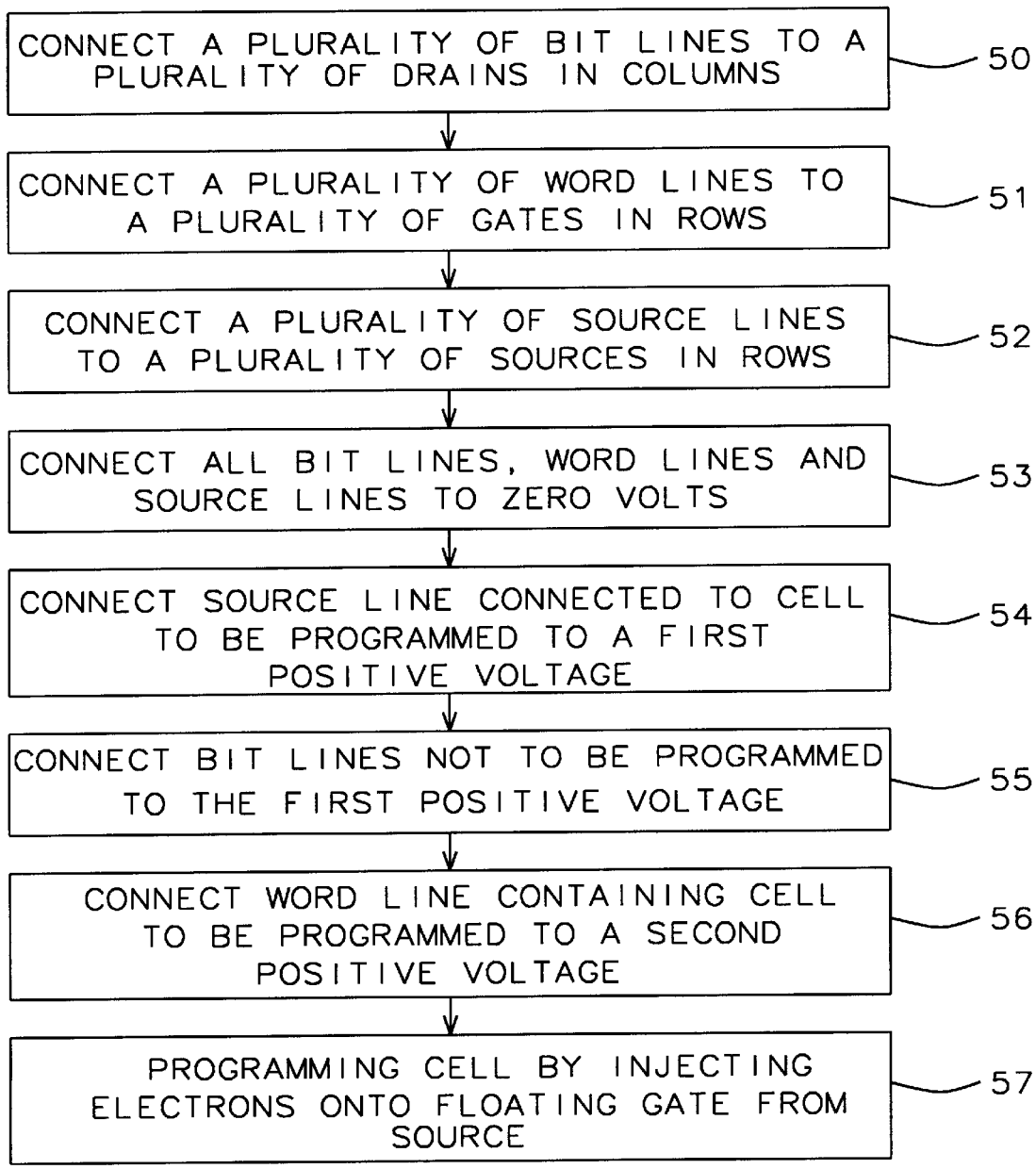
FIG. 6 is block diagram of the method of programming reverse spit gate cells in a flash memory.

Referring to FIG. 6, a flow diagram is shown for the method of programming a reverse split gate cell. A plurality of bit lines are connected to a plurality of drains in a plurality of columns of reverse split gate cells 50, and a plurality of word lines are connected to a plurality of enhancement gates in a plurality of rows of reverse split gate cells 51. A plurality of source lines are connected to a plurality of sources of a plurality of rows of reverse split gate cells 52. All bit lines, word lines and sources are initially set to zero volts 53. A source line connected to the cell to be programmed is connected to a first positive voltage 54 of approximately 5 V. This source line can be designed to provide a source voltage connection to a pair of adjacent rows of cells, and the source line can be segmented to allow only a portion of the source line to be activated for programming. Bit lines connected to cell not being programmed are connected to a voltage approximately equal to the first positive voltage 55 which is approximately the same as the 5 V connected to the source line. This blocks any current flow in the deselected cells connected to the selected word lines. The word line connected to the cell to be programmed is connected to a second positive voltage 56 of approximately 8 V which is greater than the first positive voltage. Current flowing backward in the channel of the cell being programmed produces an impact ionization near the source and programs the cell by injecting electrons onto the floating gate resulting from the potential across (he source and stacked gate of the cell being programmed.

Figure 7:
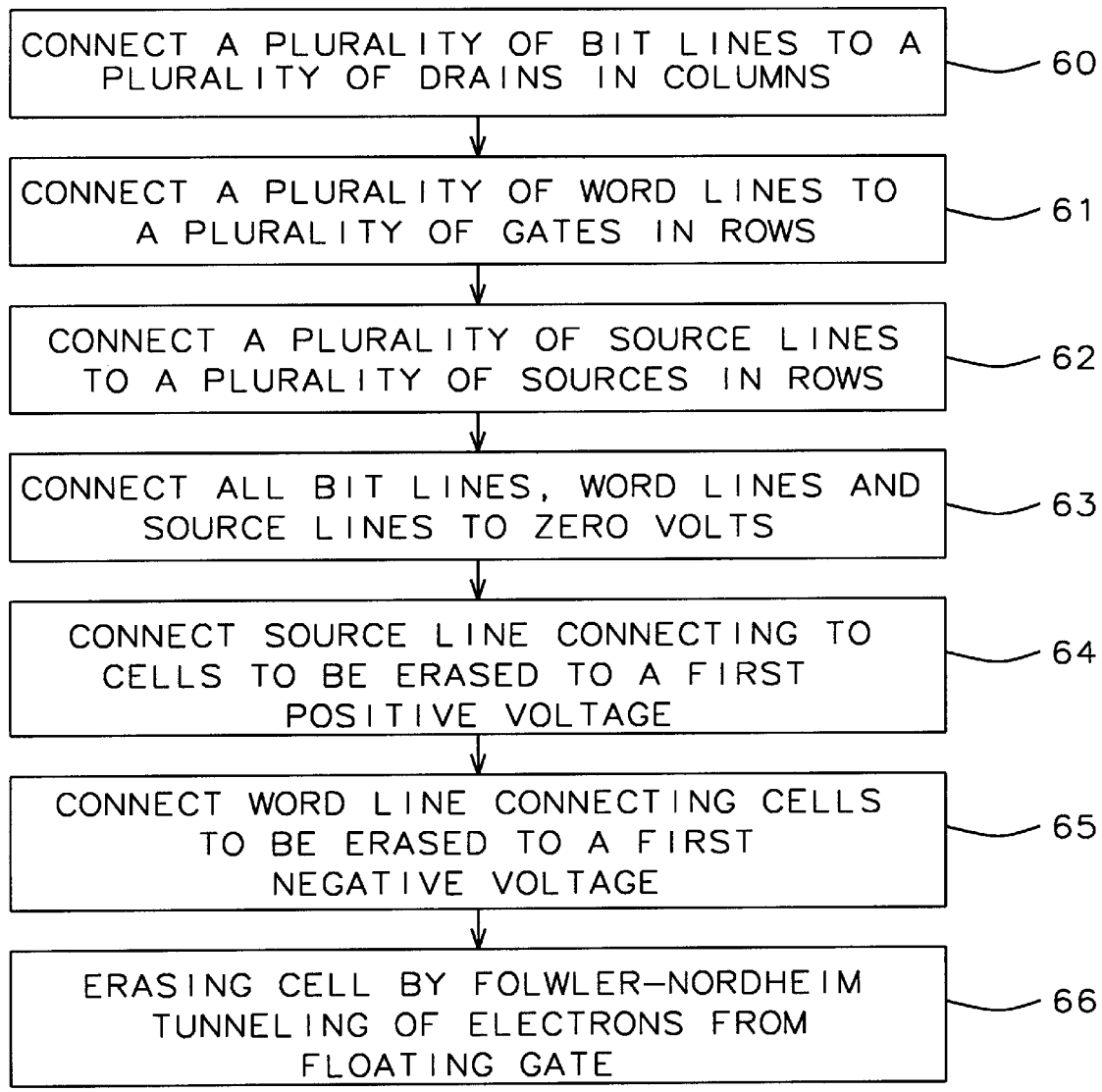
FIG. 7 is a block diagram of the method of erasing reverse spit gate cells in a flash memory

Referring to FIG. 7, a flow diagram is shown for the method of erasing a reverse split gate cell. A plurality of bit lines are connected to a plurality of drains in a plurality of columns of reverse split gate cells 60, and a plurality of word lines are connected to a plurality of enhancement gates in a plurality of rows of reverse split gate cells 61. A plurality of source lines are connected to a plurality of sources of a plurality of rows of reverse split gate cells 62. All bit lines, word lines and sources are initially set to zero volts 63. The source line connected to cells to be erased is connected to a first positive voltage 64 of approximately 5 V. The source line can be connected to adjacent rows of cells to provide a more efficient layout consuming less space, and the source line may be segmented to allow a portion of a row of cells to be erased. The enhancement gates of cells to be erased are connected by word lines to a first negative voltage 65. The first negative voltage can range from zero volts to a voltage of approximately −8 V. Electrons are removed from the floating gates of cells being erased by Fowler-Nordheim tunneling, lowering the threshold voltage of the stacked gate of a cell, and thereby erasing stored information on the stacked gate of cells 65.

Continuing to refer to FIG. 7, multiple rows of cells can be erased simultaneously, either in pairs or any other combination including rows with segmented source lines. This is done by connecting the source lines or segmented source lines of the rows of cells to be erased to the first positive voltage 64 of approximately 5 V and connecting the word lines of the cells to be erased to the first negative voltage 65. The first negative voltage can range from approximately zero volts to approximately −8 V, and erasure is accomplished by Fowler-Nordheim tunneling.

While the invention has been particularly shown and described with reference to preferred embodiments thereof, it will be understood by those skilled in the art that various changes in form and details may be made without departing from the spirit and scope of the invention.

What is claimed is:

1. An array of reverse split gate flash memory cells, comprising:
 a) a plurality of reverse split gate cells arranged in rows and columns,
 b) each row interconnected by word lines connected to an enhancement gate of each cell in said row,
 c) cells in each pair of rows interconnected by a source line connected to sources of each cell in said pair of rows wherein said source line of each pair of rows controlled independently,
 d) said source line segmented to allow partitioning of each pair of rows into more than one section and to allow erasing of cells by section, e) each column interconnected by bit lines connected to drains of each cell in said column.

2. An array of reverse split gate flash memory cells, comprising:
a) a plurality of reverse split gate cells arranged in rows and columns,
b) each row interconnected by word lines connected to an enhancement gate of each cell in said row,
c) each pair of rows interconnected by a source line connected to sources of each cell in said pair of rows,
d) said source line segmented to allow partitioning of each pair of rows into more than one section,
e) each column interconnected by bit lines connected to drains of each cell in said column,
f) said source line coupled to additional materials through metal-strapping using a plurality of contact points to connect the metal-strapping to a source line that is typically a diffusion line which reduces the resistance of the source line and allows one or more metal strapped source lines to be coupled together to achieve erasure of one or more rows of cells at the same time.

3. The array of claim 1, wherein said cell is programmed by connecting a moderate positive voltage to the source of said cell by means of said source line, zero volts to the drain of said cell by means of said bit line and a high positive voltage to the gate of said cell by means of said word line.

4. The array of claim 3, wherein program disturb conditions to other cells is eliminated by holding word lines of cells not being programmed at zero volts, bit lines of cells not being programmed at the same voltage as the source line of the cell being programmed and source lines of cells not being programmed at zero volts.

5. The array of claim 1, wherein said cell is erased by connecting a moderate positive voltage to the source of said cell by means of said source line, by connecting a voltage ranging from zero volts to a high negative voltage to the gate of said cell by means of said word line and by floating the drain of said cell by means of said bit line.

6. The array of claim 5, wherein erase disturb conditions to other cells is eliminated by holding word lines of cells not being erased at zero volts, floating bit lines of cells not being erased and holding source lines of cells not being erased at zero volts.

7. The array of claim 5, wherein a segmented source line allows only a portion of said pair of rows to be erased at one time.

8. The array of claim 5, wherein said source line is not segmented to allow a full length of said pair of rows to be erased at one time.

9. The array of claim 5, wherein more than one pair of rows of cells can be erased simultaneously by not segmenting said source lines and connecting appropriate voltages to word lines and source lines of rows to be erased.

10. The array of claim 5, wherein more than one pair of segmented rows of cells can be erased simultaneously by segmenting said source lines and connecting appropriate voltages to word lines and source lines of rows to be erased.

11. A flash memory array constructed of reverse split gate cells, comprising:
a) a plurality of reverse split gate cells arranged in a plurality of rows and a plurality of columns,
b) said reverse split gate cells constructed with enhancement gates located near drains and stack gates located near sources with said enhancement gates connected to a control gate of said stack gates,
c) each row of said plurality of rows are interconnected by means of a word line connected to said enhancement gates located on cells in that row,
d) each said row of said plurality of rows are interconnected by means of a source line connected to sources located on cells in said row wherein said source line of each said row is independently controlled,
e) each column of said plurality of columns interconnected by means of a bit line connected to a drains located on cells in that column.

12. The flash memory array of claim 11, wherein said source lines connected to the sources in rows of said reverse split gate cells are segmented to allow a portion of each row to be programmed and erased under the control of a source line selector.

13. The flash memory array of claim 11, wherein two rows of said reverse split gate cells are connected together by a common source line and erased together by applying by connecting a voltage ranging from zero volts to a high negative voltage to the word lines of said two rows and a positive voltage to the common source line with all bit lines floating.

14. The flash memory array of claim 13, wherein said common source line is segmented to allow a portion of the two rows to be programmed and erased under control of a source line selector.

15. The flash memory array of claim 13, wherein additional rows of said reverse split gate cells can be erased together in which rows in pairs with a common source line have word lines connected to said voltage ranging from zero volts to said high negative voltage and said common source line connected to said positive voltage.

16. The flash memory array of claim 15, wherein said common source line is segmented to allow a portion of the additional rows to be erased under control of a source line selector.

17. A method for programming a flash memory array constructed of reverse split gate cells, comprising:
a) connecting a plurality of bit lines to drains in a plurality of columns of reverse split gate cells in each of said columns,
b) connecting a plurality of word lines to gates in a plurality of rows of reverse split gate cells in each of said rows,
c) connecting a plurality of independently controlled source lines to sources in a plurality of rows of reverse split gate cells in each of said rows,
d) connecting all said wordlines, said bit lines, said source lines to zero volts,
e) connecting said independently controlled source line connected to said cell to be programmed to a first positive voltage of approximately five volts,
f) connecting said bit lines not connected to cell to be programmed to said first positive voltage of approximately five volts,
g) connecting said wordline connected to said cell to be programmed to a second positive voltage of approximately eight volts,
h) programming said cell by injecting electrons onto a floating gate on a source side of said cell by injecting electrons from impact ionization of current flowing through channel of said cell from said source to said drain.

18. The method of claim 17, wherein connecting said source line to a second positive voltage is to adjacent pair of rows of cells which contain said cell to be programmed.

19. The method of claim 17, wherein connecting said source line to a second positive voltage is to adjacent pair of rows of cells that are segmented which contain said cell to be programmed.

20. A method for erasing a flash memory array constructed of reverse split gate cells, comprising:
   a) connecting a plurality of bit lines to drains in a plurality of columns of reverse split gate cells in each of said columns,
   b) connecting a plurality of word lines to gates in a plurality of rows of reverse split gate cells in each of said rows,
   c) connecting a plurality of independently controlled source lines to sources in a plurality of rows of reverse split gate cells in each of said rows,
   d) connecting all said wordlines, said bit lines, said source lines to zero volts,
   e) connecting said independently controlled source line connected to cells to be erased to a first positive voltage of approximately five volts,
   f) connecting said wordline connected to said cells to be erased to a first negative voltage ranging from zero volts to a voltage of approximately negative eight volts,
   g) erasing said cells to be erased by removing electrons from floating gate on a source side of said cell by means of Fowler-Nordheim tunneling.

21. The method of claim 20, wherein connecting said source line to a pair of rows of cells to said first positive voltage and connecting said word lines of said pair of rows of cells to said first negative voltage erases all cells in said pair of rows.

22. The method of claim 20, wherein connecting all source lines connected to a plurality of rows of cells to said first positive voltage and connecting all word lines connected to said plurality of rows of cells to said first negative voltage erases all cells in said plurality of rows.

23. The method of claim 20, wherein connecting a segmented source line of a pair of rows of cells to said first positive voltage and connecting said word lines of said pair of rows of cells to said first negative voltage erases all cells in said pair of rows connected to said segmented source line.

24. The method of claim 20, wherein connecting said first positive voltage to a plurality of segmented source lines connected to a plurality of rows of cells and connecting said first negative voltage to a plurality of word lines connected to said plurality of rows of cells erases all cells connected to said plurality of segmented source lines.

* * * * *